United States Patent [19]

Kamei

[11] Patent Number: 4,940,057

[45] Date of Patent: Jul. 10, 1990

[54] APPARATUS FOR MEASURING BRAIN FUNCTION USING NUCLEAR MAGNETIC RESONANCE

[75] Inventor: Hirotake Kamei, Ibaraki, Japan

[73] Assignee: Agency of Industrial Science & Technology, Ministry of Industrial Trade & Industry, Tokyo, Japan

[21] Appl. No.: 73,718

[22] Filed: Jul. 15, 1987

[30] Foreign Application Priority Data

Jul. 15, 1986 [JP] Japan ................................ 61-166115

[51] Int. Cl.$^5$ ............................................... A61B 5/05
[52] U.S. Cl. ................................ 128/653 A; 324/318; 324/322
[58] Field of Search ................. 128/653; 324/309, 318, 324/322

[56] References Cited

U.S. PATENT DOCUMENTS 4,793,356 12/1988 Misic et al. .......................... 128/653

Primary Examiner—Ruth S. Smith
Attorney, Agent, or Firm—Oblon, Spivak, McClelland, Maier & Neustadt

[57] ABSTRACT

A brain function measuring apparatus is provided with a differential or balanced type detector or magnetic field gradient generator having at least one pair of coils for detecting resonance signals, the coils being positioned symmetrically on the left and right relative to the median line of the head of the subject who is being examined. The configuration is such that when the organism is quiet and at rest, there is no output from the detector, and when there is brain activity the state and location of the brain activity, and also higher brain functions, can be identified with high resolution from the amplitude and phase of the resonance signal differential component output from the detector.

3 Claims, 3 Drawing Sheets (a) Mathematical thought process — Left Hemisphere
(b) Music (Latin rhythm) — Left Hemisphere
(c) Music (Fusion) — Right Hemisphere
(d) Music (Classical) — Right Hemisphere

APPARATUS FOR MEASURING BRAIN FUNCTION USING NUCLEAR MAGNETIC RESONANCE

BACKGROUND OF THE INVENTION

1. Field of the Invention

This invention relates to a brain function measuring apparatus which uses nuclear magnetic resonance to discriminate and measure differences between the functions of the left and right hemispheres of a brain in vivo, the state of the functioning and the active portion locations.

2. Description of the Prior Art

There is known the technique of nuclear magnetic resonance (NMR) for recognizing fine structural changes occurring in the tissues of an organism, by imparting an oscillating magnetic field (resonant frequency) which is generated by, for example, high frequency to the spins of atomic nuclei, of which the organism is composed so as to incline a microscopic magnetic moment of the spins and detecting a free induction signal produced when the energy level of the nuclei represented by the microscopic magnetic moment reverts to the ground state. The theoretical technology has been established for using NMR to recognize in vivo blood conditions such as blood flow amount, blood flow velocity, amount of residual blood, and so forth.

It is known that when an external stimulus is applied to the living brain or when the brain cerebrates mentally, fine changes occur in the aforementioned type of blood states at the parts of the brain where such activities occur. It is considered that, in the utilization of NMR, brain activity will produce fluctuations in the order of 0.01 to 0.1 ppm in the intensity of a signal derived from the resonance of the protons of the active portion of the brain that is obtained as a free induction signal. If these minute changes can be detected, brain activities can be recognized. (See *NMR Igaku*, Vol. 6 March 1986 *Proceedings of 7th Conference of Japanese Society of Magnetic Resonance in Medicine.*)

In the determination of brain functions using the above type of NMR technique, when the resonance signals from protons in water or loosely-bound fats at the site of the activity are observed, the resonance signals undergo minute changes that are in accordance with the blood flow amount, the blood flow velocity and the residual blood amount. However, the obtained resonance signals are not only from protons in the blood flow, but are instead from protons in all the tissues, and the intensity fluctuation in resonance signals coming from the blood flow accompanying brain activity will account for no more than about 0.01 to 0.1 ppm of the resonance signals from the whole of the tissues.

With such resonance signal observation techniques, various signals can be obtained from NMR. Changes in blood flow velocity has an effect on the spin-echo signal in the state when a magnetic gradient has been applied, and a change in the residual amount of blood produces a change in the intensity of the free induction decay signal.

Therefore, if the free induction decay signals or spin-echo signals are observed, changes in the blood flow can be found from the changes in the said signals, and the comparative identification of these changes arising from brain activity can enable brain activity to be recognized.

With the conventional apparatus for determining brain function using the phenomenon of NMR, a problem has been that the computing of the minute changes in the proton resonance signal involved the use of such computation processing as accumulation and Fourier transforms, and to implement this, the resonance signal obtained is quantized by an A/D converter. However, because the said change is in the order of a minute 0.01 to 0.1 ppm, the detection signal was buried within a single one of the bits that form the quantization unit, so the change cannot be detected from the digital output.

SUMMARY OF THE INVENTION

In order to solve the aforementioned problems, an object of the present invention is to provide a brain function measuring apparatus which utilizes NMR for the high-resolution measurement of just the changes in the resonance signal produced by in vivo brain activity, and thereby enables the active part and state of activity of the brain to be recognized accurately.

To attain the above object, the brain function measuring apparatus according to this invention is comprised of magnetic excitation coils and resonance detection means provided with two coils positioned symmetrically to the left and right relative to the median line of the head of the subject.

With the subject in a stationary state of rest, the coils positioned to oppose each other symmetrically to the left and right of the median line of the subject's head are differentially connected so that the resonance signals output by the coils cancel each other out. Alternatively, a resonance signal detector comprises balanced circuits of a plurality of coil pairs which operate under a magnetic field gradient. When the subject receives an external stimulus or when the subject is in a state of cerebration, the differential component of the resonance signal output produced in each pair of coils is manifested as output from the detection circuit. The active part and state of activity of the brain can then be recognized by analyzing the phase and amplitude of this differential signal. By subjecting the said signal to processing such as Fourier transform processing, a tomographic image of the active portion of the brain can be displayed.

Other objects and features of the invention will become apparent from the following detailed description in conjunction with the accompanying drawings.

DETAILED DESCRIPTION OF THE PREFERRED EMBODIMENT

Figure 1:
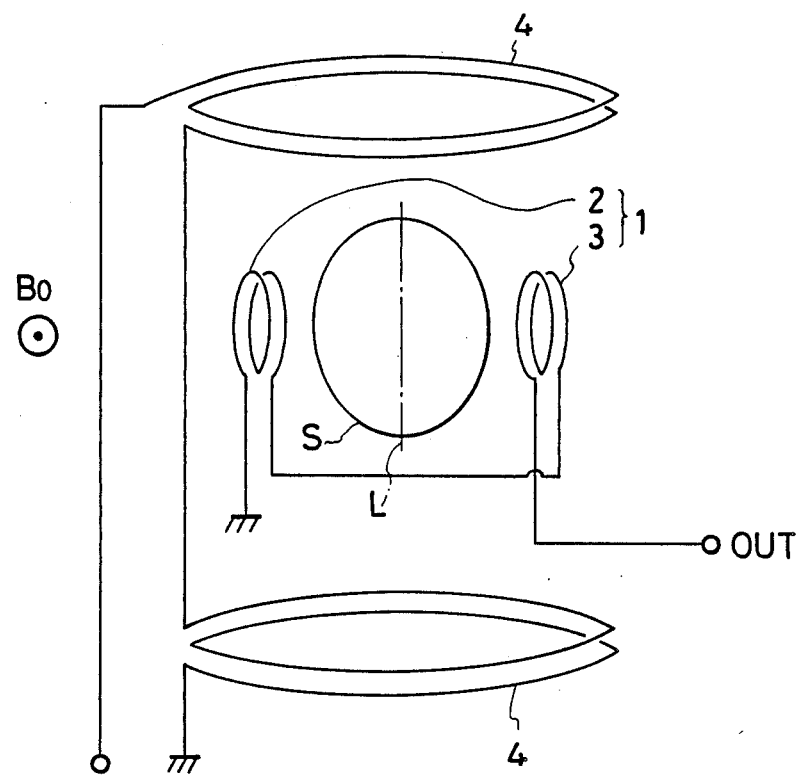
FIG. 1 is an abbreviated explanatory drawing of one embodiment of the brain function measuring apparatus of the present invention.

With reference to FIG. 1 which shows one embodiment of the brain function measuring apparatus of the present invention, a detection means 1 is comprised of NMR signal detection coils 2 and 3 which are arranged symmetrically in opposition to each other on each side of the median line L of a subject's head S to constitute a differential coil. The numeral 4 denotes rotational magnetic field exciting coils disposed in the vicinity of the subject portion, and $B_0$ is the magnetic flux density of a static magnetic field. The detection coils 2 and 3 are connected differentially so that the NMR signal arising in one coil has a phase that is the opposite of the NMR signal arising in the other coil. In the balanced state when the brain of the subject is quiescent, the free induction signals obtained by the coils 2 and 3 cancel each other out, and as a result little signal appears at the output terminal (OUT). Brain activity such as cerebration or an external stimulus causes a difference in the blood flow velocity, blood flow amount and residual blood amount between the right and left hemispheres in the subject's head S. Therefore, by using the coils 2 and 3 of the detection means 1 to detect the changes in blood states, a difference will be produced between the free induction decay signals detected by one of the coils and that detected by the other. As a result, the free induction signal differential component is manifested as an output signal. The amplitude of the output signal indicates the hemisphere function differential for discriminating the brain activity, while the phase indicates the dominant hemisphere that produced the stronger of the free induction decay signals obtained from the two sides. On the basis of the phase and frequency informations, it is moreover possible to identify the location at which the signal was produced. The exciting rotational magnetic field for producing the free induction signal can be applied by the exciting coil 4, or it may instead be applied by the coils 2 and 3.

Figure 2:
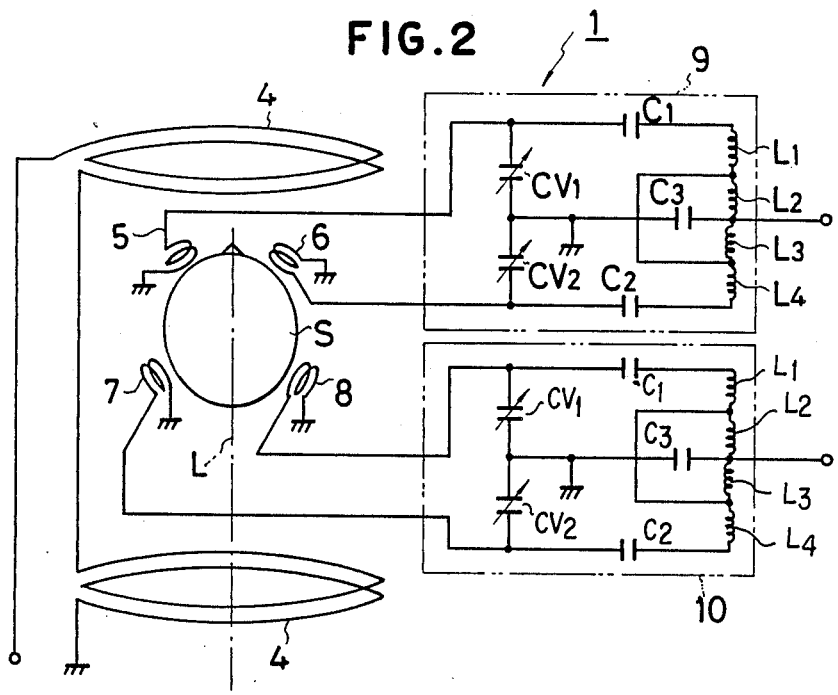
FIG. 2 is an abbreviated explanatory drawing of another embodiment.

FIG. 2 shows the working principle of an embodiment which uses a balanced detector in place of the differential type free induction decay signal detector coil of the foregoing embodiment. In the drawing, parts that are the equivalent of the parts in the embodiment shown in FIG. 1 have been numbered the same, and further explanation thereof is therefore omitted. In this embodiment, the resonance signal detection means 1 is comprised of coils 5 and 6 and coils 7 and 8 arranged symmetrically on each side of the subject's head S with respect to the median line L of the head, and balanced detectors 9 and 10 to which are input the respective signals induced in the said coils 5 and 6 and coils 7 and 8. The balanced detectors 9 and 10 are comprised of variable capacitors CV1 and CV2, capacitors C1 to C3, and coils L1 to L4. Coils L2 and L3 are wound in mutually opposite directions. If the balanced detectors 9 and 10 are set to be in equilibrium when the brain is at rest, signals induced between the two pairs of coils 5, 6 and 7, 8 are cancelled out and no output appears at the output terminals of the balanced detectors 9 and 10. When the resonance signals produced as a result of brain activity shows a difference between the right and left hemispheres of the brain, the difference signal produces an output at the output terminals of the balanced detectors 9 and 10. The amplitude thereof enables right-left hemisphere activity to be differentiated; and, from the phase thereof, it can be ascertained which hemisphere was more active.

If upon the application of an external stimulus there is a signal output from the balanced detector 9, and after a fixed interval there is a signal output from the balanced detector 10, it becomes possible to measure higher-level functions of the cerebrum, such as the motion and speed of motion of the part of the brain that undergoes activity in response to the stimulus.

The exciting rotational magnetic field for producing the free induction signal can be applied by the coils 5, 6 and coils 7, 8, or by the exciting coil 4.

With reference to FIGS. 1 and 2, in order to find the position of the brain activity in the depth direction of the brain, a linear magnetic field gradient is applied perpendicularly to the median line L and the information relating to the position is obtained as changes in the resonance frequency, thereby enabling the position of the active portion to be known.

The resolution of the position discrimination can be improved by increasing the number of coil-pairs.

Figure 3:
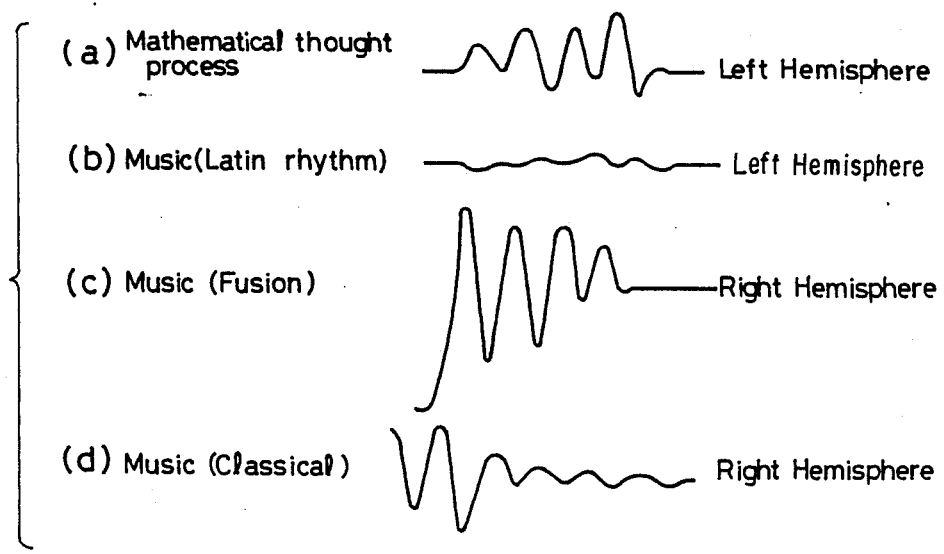
FIGS. 3(*a*) to 3(*d*) show brain activity waveforms resulting from experiments using the apparatus of the present invention.

FIGS. 3(a) to 3(d) show examples of actual measurements conducted using the apparatus of the above embodiment. FIG. 3(a) is the waveform of a resonance signal obtained from the left hemisphere when the subject was given a mathematically oriented task to do, FIG. 3(b) is the waveform of a signal from the left hemisphere when the subject was listening to a Latin rhythm while the waveforms of FIGS. 3(c) to 3(d) were obtained from the right hemisphere when the subject was listening to music. In the case of FIG. 3(c) the aforementioned music was fusion music; and in the case of FIG. 3(d) it was classical music. It is clear from this that mathematical tasks and perception of the Latin rhythm make the left hemisphere work, while feelings and emotions are controlled by the right hemisphere. This tallies with what is generally recognized in this respect.

Figure 4:
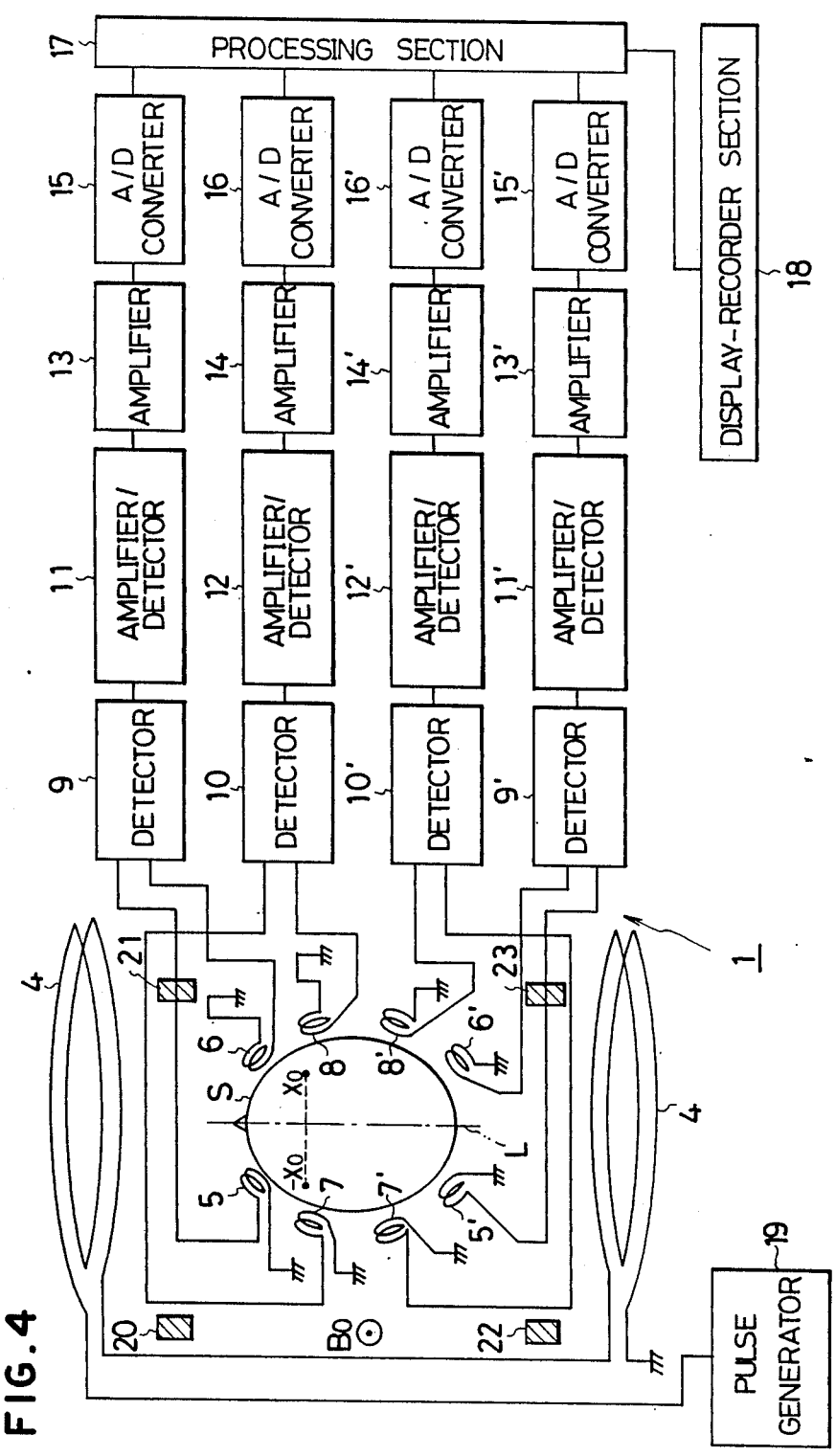
FIG. 4 is an abbreviated block diagram of another embodiment of the present invention.

FIG. 4 shows another embodiment employing the type of balanced detector shown in FIG. 2. In the drawing, parts that are the equivalent of the parts in the embodiment shown in FIG. 2 have been numbered the same, and further explanation thereof is therefore omitted.

The numerals 5', 6', 7' and 8' are coils; 9' and 10' are balanced detectors; 11, 11' and 12, 12' are high-frequency amplifiers/phase sensitive detectors; 13, 13' and 14, 14' are low-frequency amplifiers; 15, 15' and 16, 16' are A/D converters; 17 is a processing section; 18 is a display-recorder section; 19 is a high-frequency pulse generator; and 20 to 23 are magnetic gradient generating coils.

The operation of the above embodiment will now be explained.

The high-frequency pulse generator 19 sends high-frequency current through the coil 4 in pulses of a fixed duration, tilting the magnetization vectors, which had been oriented in the direction of the static magnetic field, and producing magnetization vectors perpendicular to the static magnetic field, i.e., horizontal magnetization vectors. After the application of high-frequency pulses is stopped, the energy level of the horizontal magnetization vectors undergoes a reversion from the excited state to the ground state, which induces a high-frequency current in the detection coils 5 to 8 and 5' to 8'. This is the resonance signal. The NMR frequency ($\omega_0$) is shown by $\gamma B_0$ and is proportional to the magnetic flux density $B_0$ of the static magnetic field. Here, $\gamma$ is a constant peculiar to the type of nucleus. If a magnetic field gradient is now applied symmetrically with respect to the median line L, the resonance frequencies at positions that are symmetrical with respect to the median line L (coil 6 with respect to coil 5, and so forth) will become mutually equal. If the magnitude of the magnetic field gradient is known beforehand, from the resonance frequency, the position of the active portion of the brain from the median line L can be found.

Here, we will consider brain locations $-x_o$, $x_o$ which are symmetrical with reference to the median line L. When there is activity at a location corresponding to $-x_o$, the intensity of the resonance signal will change in accordance with change in the blood flow. The intensity of the free induction signal accompanying the high-frequency pulses will increase with the increase in blood flow that accompanies brain activity. If the magnitude of the magnetic field gradient is G (the magnetic field gradient is made to increase, or to decrease, in accordance with separation to the left/right from the median line L), the frequency component $\omega_L = \gamma(B_0 - Gx_0)$ in the resonance signals induced in the coil 7 will increase. On the other hand, there will be no change in the intensity of the signal induced in the coil 8.

When a difference is detected, by the balanced detector 10, between the signals induced in the coils 7 and 8 in the output, only signals having the frequency component $\omega_L = \gamma(B_0 - Gx_0)$ will be detected. By then amplifying the signal by means of high-frequency amplifier/phase sensitive detector 12 and applying phase shift detection, a low-frequency signal is obtained. This is amplified by the low-frequency amplifier 14, passed through the A/D converter 16 and passed to the signal processing section 17 as a digital signal. By subjecting the signals in this time domain to Fourier transformation, they are converted to frequency domain signals. This enables positional information to be obtained easily, and from this positional information the location of the site of brain activity can be found. Image processing techniques can be used to distinguish the active portion on a tomographic image.

The high-frequency current induced in coils 7 and 8 are applied to the balanced detector 10 as signals of opposite phase. If the phase relationship in the balanced detectors 9, 10 and 9', 10' is known before hand, it can be known from the phase of a detected signal whether the active portion is in the left cerebral hemisphere or the right hemisphere. The location of the active portion can be established three-dimensionally, i.e. from the position of the detection coil, the phase of the detected signal, and the frequency. When the signal intensity is sufficiently high, the low-frequency amplifiers 13, 14 and 13', 14' can be dispensed with.

A tuning condenser may be added to each detection coil, and after high-frequency amplification the signal may be conducted to the balanced detectors 9, 10 and 9', 10'. Or, the signal may be conducted to the balanced detectors 9, 10 and 9', 10' after phase shift detection.

As explained in the foregoing, in accordance with this invention, by disposing at least one pair of coils symmetrically to the left and right of the median line of a subject's head in order to obtain resonance signals produced by NMR, and using settings such that in a quiescent state there is no output from the coils, the coils will only output a resonance signal produced by brain activity. Therefore, the minute resonance signals do not get buried by resonance signals that are not from the intended object of detection, making it possible to perform the signal detection with a high resolution and high S/N ratio, thereby enabling the active portion of the brain, and the active state, to be recognized.

What is claimed is:

1. A brain function measuring apparatus employing nuclear magnetic resonance, comprising:

means for uniformly applying a static magnetic field to a subject so that the head of the subject is located at the center of the static magnetic field;

rotational magnetic field exciting means set in place about the head of subject for producing magnetization vectors perpendicular to the static magnetic field;

a plurality of signal detection coil means arranged about the head of the subject and each of said signal detection coil means comprising two coils arranged in symmetrical opposition to the left and right of a median line of the head of the subject and connected so that two nuclear magnetic resonance signals are produced wherein said two nuclear magnetic resonance signals are in phase opposition;

a plurality of balanced detector means each connected to one of said plurality of detection coil means for comparing said two resonance signals and detecting a differential component of said two resonance signals;

processing means for effecting Fourier transformation of the differential component into positional information and detecting the location of the site of brain activity from said positional information; and display recorder means for three-dimensionally displaying the detected location of the site of brain activity.

2. The apparatus according to claim 1, wherein said plurality of signal detection coil means comprise four signal detection coil means.

3. The apparatus according to claim 1, further comprising means for applying a magnetic field gradient to the head of the subject symmetrically with respect to the median line.

* * * * *